United States Patent [19]

Saito et al.

[11] 4,415,385
[45] Nov. 15, 1983

[54] DIFFUSION OF IMPURITIES INTO SEMICONDUCTOR USING SEMI-CLOSED INNER DIFFUSION VESSEL

[75] Inventors: Osamu Saito; Hideo Homma, both of Hitachi; Hirokazu Inoue, Ibaraki; Naohiro Momma, Hitachi, all of Japan

[73] Assignee: Hitachi, Ltd., Tokyo, Japan

[21] Appl. No.: 291,042

[22] Filed: Aug. 7, 1981

[30] Foreign Application Priority Data

Aug. 15, 1980 [JP] Japan .................. 55-111653
Oct. 9, 1980 [JP] Japan .................. 55-140444

[51] Int. Cl.³ .................................. H01L 21/223
[52] U.S. Cl. ........................ 148/189; 148/186
[58] Field of Search ....................... 148/189, 186

[56] References Cited

U.S. PATENT DOCUMENTS

| 3,377,216 | 4/1968 | Raithel | 148/189 |
| 3,573,116 | 3/1971 | Cohen | 148/189 X |
| 3,589,953 | 6/1971 | Traxler | 148/189 |
| 3,852,129 | 12/1974 | Diguet | 148/189 |
| 3,948,696 | 4/1976 | Inaniwa et al. | 148/189 |
| 3,997,379 | 12/1976 | Roshowski | 148/189 |
| 4,124,417 | 11/1978 | Sirot et al. | 148/189 |

OTHER PUBLICATIONS

Rosnowski, "Aluminum Diffusion into Silicon in an Open Tube High Vacuum System", J. Electrochem. Soc., vol. 125, No. 6, Jun. 1978, pp. 957-962.

Primary Examiner—G. Ozaki
Attorney, Agent, or Firm—Antonelli, Terry & Wands

[57] ABSTRACT

A dual-enclosure semi-closed diffusion wherein an outer enclosure is evacuatable and an inner enclosure has a limited aperture, the inner enclosure includes a diffusion vessel having an aperture and a baffle for partially blocking the aperture to leave the limited aperture.

The outer enclosure is not directly exposed to impurity vapor and sustains a pressure difference, while the inner enclosure is not subjected to a substantial pressure difference.

20 Claims, 7 Drawing Figures

DIFFUSION OF IMPURITIES INTO SEMICONDUCTOR USING SEMI-CLOSED INNER DIFFUSION VESSEL

BACKGROUND OF THE INVENTION

The present invention relates to diffusion of impurities into a semiconductor body and more particularly to diffusion of impurities reactive with the diffusion tube into a semiconductor body.

Typical conventional diffusion techniques include open tube diffusion and sealed or closed tube diffusion. According to the open tube diffusion, a carrier gas is allowed to flow into a diffusion tube from one end and exhausted through the other end. Diffusion source vapor is mixed into the carrier gas at some location either outside or inside of the diffusion tube. On the other hand, sealed tube diffusion utilizes a sealed tube containing a diffusion source and semiconductor wafers. The diffusion tube is evacuated with or without the backfill of an inert gas before sealing. Naturally, there is no way of exhausting or ventilating the diffusion chamber after sealing. Moreover, after the diffusion process at a high temperature, the diffusion tube is cut for unloading the diffused semiconductor wafers. The diffusion tube, usually made of quartz, is discarded after each diffusion run.

There is also proposed evacuated open tube diffusion which may resemble the sealed tube diffusion in the point that the diffusion chamber is evacuated. In contrast to the sealed tube duffusion, the diffusion tube is continuously evacuated and the impurity vapor is freely exhausted.

U.S. Pat. No. 3,997,379 to Rosnowski proposed evacuated open tube method wherein vacuum drawn during diffusion is regulated as an additional control of the diffusion.

Rosnowski also proposed semi-closed open tube high vacuum diffusion of aluminum into silicon, in J. Electrochem. Soc.: Solid-State Science and Technology, June 1978, pp. 957-962, wherein a "restrictor" is inserted into the open end of a quartz diffusion tube for regulating the aluminum vapor outflow rate during the process. The diffusion tube is pre-treated at 1100° C. to have a coating of mixture of alumina and silicon, which serves as a passivation layer during diffusion.

There is a general problem in diffusing those impurities which react with the diffusion tube. The reacted diffusion tube may be devitrified and become weak in strength. Coating of a passivation material as employed by Rosnowski may serve to reduce the reaction itself, but requires an extra step in diffusion process.

Decrease in the strength of a diffusion tube is dangerous, particularly when the diffusion tube is to be evacuated. It is desired that the diffusion system can be repetitively used safely.

SUMMARY OF THE INVENTION

An object of the present invention is to provide semi-closed diffusion which can elongate the service life of a diffusion system.

According to an aspect of the present invention, the diffusion system has a dual structure wherein a semi-closed diffusion chamber is accommodated in an evacuatable enclosure.

The diffusion chamber is comprised of an open vessel having an opening and a removable baffle member for partially blocking the opening, and is adapted to accommodate a diffusion source and a semiconductor body therein to carry out diffusion. There is little pressure difference across the wall of the diffusion chamber by virtue of the semi-closed structure. Thus, the diffusion chamber needs not to have a high strength.

The enclosure sustains the pressure difference when the diffusion system is evacuated. The enclosure is not directly exposed to the vapor of diffusion impurity.

The semi-closed diffusion chamber has the opening capable of exhausting the atmosphere in the diffusion chamber especially during the preheat treatment. The preheat treatment is important, mainly for desorbing adsorbed gas molecules from the diffusion chamber. Water molecules may usually be the most poisonous substance particularly for those diffusion sources which can be easily oxidized at high temperatures. Regardless of the kind of atmosphere (vacuum or inert gas) in the diffusion process, the diffusion chamber is preliminarily baked in the preheat treatment at a temperature not lower than 450° C. and below the diffusion temperature for a sufficient period to substantially outgas the adsorbed molecules. The baking temperature is preferably in the range of about 500 to about 800° C. and the baking period is preferably not less than about ten minutes.

After the evacuated baking step, the diffusion chamber is heated to diffusion temperatures to carry out diffusion. Confinement of the impurity vapor in the diffusion chamber is largely influenced by the surface area of the diffusion source and the conductance of the opening. When the opening is too large, the impurity vapor easily outflows from the diffusion chamber to lower the partial pressure of the impurity vapor. Analyzing the experimental data by means of an equivalent open area of an imaginary opening having an infinitely small thickness which has the same conductance to that of the real opening, it has been found that the ratio of the equivalent open area to the surface area of the diffusion source is preferably not higher than about $1 \times 10^{-1}$.

DETAILED DESCRIPTION OF THE PREFERRED EMBODIMENT

A conventional semi-closed diffusion will be described referring to FIG. 7 for enhancing comprehension of the present invention.

Figure 7:
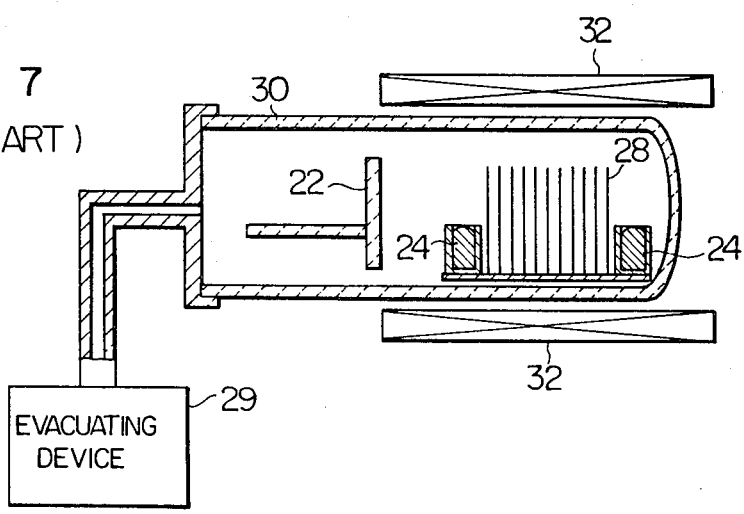
FIG. 7 is a schematic cross-section of a conventional semi-closed diffusion system.

In FIG. 7, a quartz diffusion tube 30 accommodates therein silicon wafers 28 and aluminum diffusion sources 24 and is connected to an evacuating device 29. A baffle or restrictor plate 22 is placed in the diffusion tube 30 to regulate the impurity vapor outflow rate during diffusion. The furnace tube 30 is preliminarily treated by depositing aluminum in a furnace 32 so as to have a passivation coating of ($Al_2O_3$+Si) on the inner surface. Diffusion is carried out by heating the diffusion chamber defined by the restrictor 22 in the furnace 32. In the diffusion process, the diffusion tube 30 is directly exposed to the aluminum vapor which can strongly react with quartz. Although the passivation coating may reduce the reaction, it can hardly prevent the reaction to a negligible order. Further, the preliminary treatment requires an extra step in the diffusion. Now, the embodiments of the present invention will be described.

The present inventors have found that the diffusion tube of the conventional art concurrently is achieving two distinct functions; (a) confining the impurity vapor and (b) separating the diffusion system from the ambient atmosphere and sustaining the pressure difference when evacuated. The service life of the diffusion tube depends on the decrease in the strength of the tube for preventing smash or destruction of the diffusion tube upon evacuation.

According to the present invention, the diffusion space is dually enclosed. The outer enclosure separates the diffusion system from the ambient atmosphere and sustains the pressure difference upon evacuation. The inner enclosure substantially confines the diffusion space and yet has some degree of conductance therethrough, enabling communication between the inside and the outside of the inner enclosure.

Figure 1:
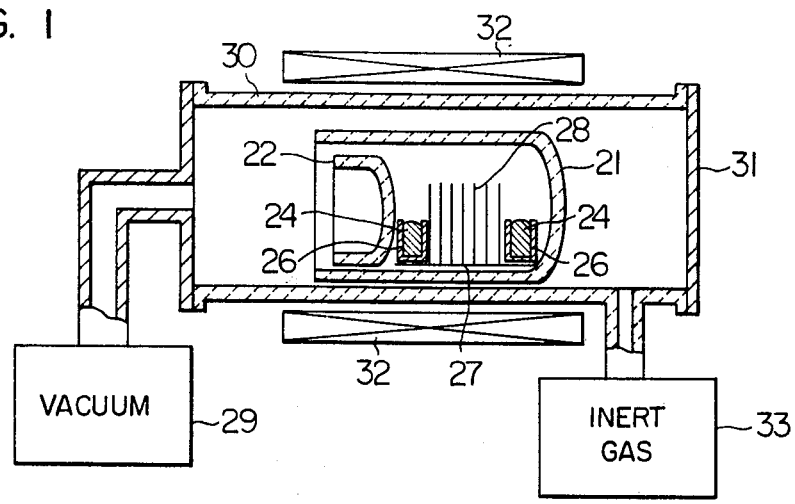
FIG. 1 is a schematic cross-section of a semi-closed diffusion system.

FIG. 1 shows a diffusion system comprising an outer enclosure including a furnace tube 30 and a hermetically fitting end plate 31 and an inner enclosure including a diffusion tube 21 and a baffle 22 for partially blocking the opening of the diffusion tube 21. The outer enclosure is connected to a vacuum device 29 and an inert gas container 33 for enabling evacuation and introduction of an inert gas. The inner enclosure accommodates semiconductor wafers 28 disposed on a wafer holder 27 and a diffusion source 24 disposed on boats 26. The diffusion space defined by the inner enclosure can be heated by a furnace 32. The outer enclosure, which sustains the pressure difference, is not directly exposed to the diffusion space and can be substantially kept from the reaction with the impurity vapor. The inner enclosure substantially confines the impurity vapor but is not subjected to the substantial pressure difference even when the outer enclosure is evacuated. Thus, the service life of both the outer enclosure and the inner enclosure can be made very long.

In operation, the semiconductor wafers 28 and the diffusion source 24 are loaded in the diffusion tube 21 and the baffle member 22 is fitted at the opening, i.e., is loosely inserted into the tube to form a semi-closed diffusion chamber. The diffusion tube is then inserted into the furnace tube 30 and the furnace tube 30 is sealed with the end plate. The furnace tube may be evacuated and backfilled with inert gas several times for reducing undesirable residue gas components. While evacuating the furnace tube, the diffusion chamber is heated to degas adsorbed molecules. Water molecules may be the most harmful impurity for the diffusion process. Upon slow heating, adsorbed water molecules are desorbed most violently in a temperature range between about 450° to 500° C. Thus, the degassing temperature is preferably at least about 450° C. and more preferably at least about 500° C. At higher temperatures, the diffusion source may be oxidized more easily by the desorbed water molecules. Thus the degassing temperature is preferably not higher than about 800° C. It will be apparent that diffusion hardly occurs at such temperatures. Further, if the exhausting rate is too low, the desorbed molecules cannot be easily exhausted and may react with the diffusion source. It was found that the value of V/C, where V is the volume of diffusion space and C is the conductance of the molecular flow for water molecules, is preferably not longer than about two seconds. After the degassing heat treatment, diffusion is carried out at higher temperatures. Inert gas may be introduced depending on the species of diffusion source and the application purpose. After cooling the diffusion chamber, the semiconductor wafers 28 are unloaded in the reverse order to that of loading; opening the end plate 31, drawing the diffusion tube out of the furnace tube, removing the baffle 22 and retrieving the semiconductor wafers 28.

Figure 2:
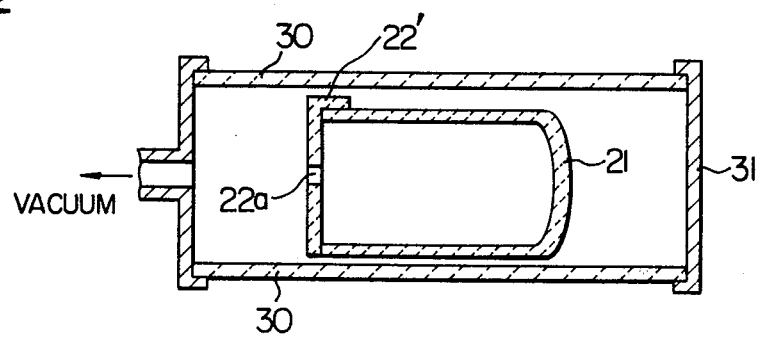
FIG. 2 is a schematic cross-section of another semi-closed diffusion system.

FIG. 2 shows a modification of the diffusion system, wherein the furnace tube 30 is connected only to the vacuum device (not shown) and a baffle member 22' is fitted external to the diffusion tube and has a small through aperture 22a.

Embodiments of diffusing aluminum and gallium into silicon wafers utilizing the diffusion system of FIG. 1 will be described in detail hereinbelow.

ALUMINUM DIFFUSION

Aluminum diffusion is carried out in evacuated atmosphere. The sheet resistivity of diffused layers is dependent on the aluminum vapor pressure as well as on the diffusion temperature during diffusion. The aluminum vapor pressure is considered to depend on the generation and the outflow of aluminum vapor in and from the diffusion chamber. When the pressure in the diffusion system is very low (high vacuum), the motion of aluminum molecules may be approximated by molecular flow.

Let us assume that a semi-closed diffusion chamber has an opening and that the aluminum vapor pressure outside and inside of the diffusion chamber is $P_1$ and $P_2$.

The rate N of effusion, at which the aluminum vapor flows from the diffusion chamber to the outside through the opening, can be given by $$N = C(P_1 - P_2) \tag{1}$$

where C is the conductance showing how easily aluminum molecules pass through the opening. When the pressure $P_2$ at the outside of the chamber is far lower than the pressure $P_1$ inside the chamber, the rate N of effusion of aluminum vapor can be expressed by $$N = CP_1 \tag{2}$$

As is evident from the above formula, the rate N of effusion of impurity vapor at the opening depends on the conductance but not on the shape of the opening provided that the conductance of the opening is kept constant. Accordingly, when we consider the rate N of effusion for the impurity vapor flowing out from a diffusion chamber through an opening with a conductance C, the opening may be replaced by another opening which has the same conductance with a simplified shape. An aperture defined by infinitely thin wall having an aperture area $S_o$ is used herein as the equivalent opening having the simplest shape. Then, the rate N of effusion for impurity vapor can be given by $$N = ZS_o \tag{3}$$

where Z indicates the amount of impurity vapor incident on unit area per unit time. Accordingly, the relation between the conductance C and the equivalent open area $S_o$ of the above-mentioned infinitely thin aperture is given by $$C = (Z/P_1) S_o \qquad (4)$$

On the other hand, the rate $N_{ev}$ of evaporation, at which impurity atoms are vaporized, may be approximated assuming the equilibrium state. When equilibrium is established between the source and the vapor, the rate $N_{ev}$ of evaporation is equal to the rate $N_{con}$ of condensation, at which the vapor of impurity condenses. The rate $N_{con}$ of condensation may be approximated to be equal to a product ZS, where S indicates the surface area of the aluminum source. Thus, the rate $N_{ev}$ of evaporation can be expressed by $$N_{ev} = ZS \qquad (5)$$

From equations (3) and (5), $$N/N_{ev} = S_o/S \qquad (6)$$

As is apparent from the above relation, the ratio $N/N_o$, i.e., the ratio of the rate N of effusion at the opening to the rate $N_{ev}$ of evaporation in the diffusion chamber may be approximated simply by the ratio $S_o/S$, i.e., the ratio of the area $S_o$ of equivalent aperture, to the surface area S of the impurity source. For example, when the ratio $S_o/S$ is on the order of $10^{-2}$, the rate N of effusion will be about one hundredth of the rate $N_{ev}$ of evaporation.

An example of calculating the equivalent open area of the imaginary aperture of infinitely thin thickness corresponding to a real opening will be explained below. Let us consider the case where a real opening is a cylinder having an inner radius r and a length l. The conductance C of this opening for the molecular flow condition is given by $$C = \frac{1}{1 + \frac{3l}{8r}} \times \frac{\bar{v} \pi r^2}{4}, \qquad (7)$$

where $\bar{v}$ indicates mean velocity of molecules under consideration. The conductance C of an imaginary aperture having an area $S_o$ and no thickness is given by $$C = \frac{\bar{v} S_o}{4}. \qquad (8)$$

By equating the conductance C given by equation (7) to the conductance C given by equation (8), the equivalent area $S_o$ of an imaginary aperture of null thickness having the same conductance to the actual opening, can be expressed in terms of dimensions (e.g., radius and length) of the actual opening as $$S_o = \frac{\pi r^2}{1 + \frac{3l}{8r}}. \qquad (9)$$

Since $\pi r^2$ indicates a cross sectional area $S_{oa}$ of the real opening, the area $S_o$ of the equivalent aperture is given by $$S_o = \frac{S_{oa}}{1 + \frac{3l}{8r}}. \qquad (10)$$

As is apparent from equation (10), the equivalent open area $S_o$ of the imaginary aperture becomes small as the length l of the actual opening becomes greater.

Here, it may be noted that the semi-closed diffusion chamber is characterized by having a finite value of $S_o$, in contrast to the sealed diffusion chamber, for enabling evacuation of the diffusion chamber. If the ratio $S_o/S$ is made extremely small, impurity vapor is well confined in the diffusion chamber, but it becomes difficult to effectively evacuate the diffusion chamber and to adjust the pressure inside the chamber.

In order to clarify the effect of the ratio $S_o/S$, both of the conductance C of the opening and the surface area S of the aluminum source were varied to change the ratio $S_o/S$, and diffusion was carried out into silicon wafers at each value of ratio $S_o/S$ at a diffusion temperature of about 1100° C. and for a period of about 5 hours. The measured ambient vacuum was kept mainly on the order of $10^{-7}$ torr during diffusion.

Figure 3:
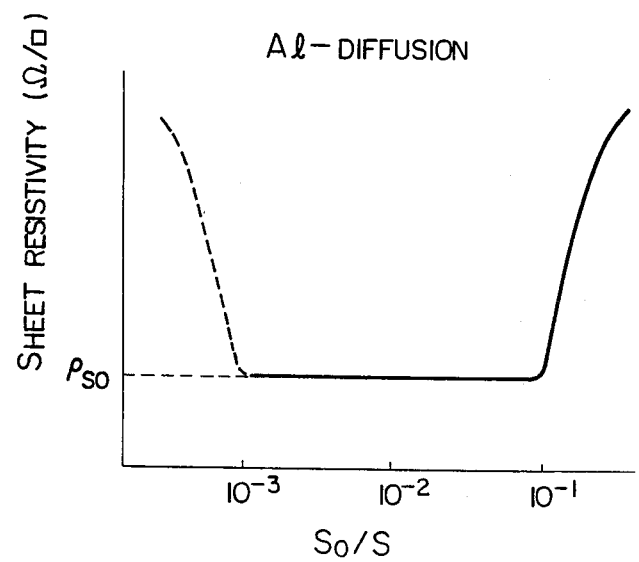
FIGS. 3 to 5 are graphs showing data of diffusion.

The results of experiment are shown in FIG. 3, wherein the sheet resistivity takes an almost uniform and low value for an $S_o/S$ range of about $1 \times 10^{-3}$ to about $1 \times 10^{-1}$. The existence of an upper limit, about $1 \times 10^{-3}$, is considered to be apparently ascribed to the confinement effect of the semi-closed diffusion chamber. Namely, when the ratio $S_o/S$ is greater than about $1 \times 10^{-1}$, the aluminum vapor will outflow excessively to lower the vapor pressure of aluminum and produce higher sheet resistivities. Therefore, it is preferable to select the ratio $S_o/S$ not larger than about $1 \times 10^{-1}$.

The lower limit of $S_o/S$ would be ascribed to insufficient exhaust of desorbed molecules. Based on the conductance of the opening for water molecules at the temperatures, about 500° to about 800° C., used for degassing, it is considered that the sheet resistivity is apt to become high if the value V/C is larger than about 2 seconds, where V is the volume of the diffusion chamber. It was observed that with an increase of the average sheet resistivity, the dispersion in the sheet resistivity among samples also became large. The conductance becomes large with the increase in the temperature. The desorption of adsorbed molecules was found to become vigorous in a temperature range of about 450° to 500° C. Thus, it was found preferable to select the ratio V/C for 450° C. condition less than about 2 seconds, and further preferable to select the ratio V/C for 450° C. condition less than about 1.5 seconds for obtaining a low sheet resistivity with high reliability. It will be apparent that V/C for 450° C. condition simply means the value of V/C at 450° C., but never that heat treatment be achieved at 450° C.

Examples of successive aluminum diffusion run will be described hereinbelow. A single-ended quartz tube which was 103 mm in outer diameter, 99 mm in inner diameter and 500 mm in length, was used as the diffusion or reaction tube 21. A silicon boat 26 having a bottom surface of about 18 cm² and 500 mg of metallic aluminum 24 acting as a diffusion source disposed thereon, a quartz wafer holder 27 carrying ten silicon wafers 28 each having a diameter of 80 mm, and another boat 26 having a bottom surface of about 18 cm² and 500 mg of metallic aluminum 24 acting as the diffusion source disposed thereon were loaded in the quartz reaction tube 21 in the order described. Then, a baffle member in the form of a loose quartz plug 22, which was 97 mm in outer diameter and 70 mm in length, was inserted into the quartz reaction tube 21 to form a semi-sealed diffusion chamber. In this case, the maximum gap between the reaction tube 21 and the loose plug 22 was 2 mm, and the conductance C of this opening for aluminum molecules at the diffusion temperature of 1100° C. was about 10 l/sec. The area $S_o$ of equivalent aperture which was calculated from the above conductance C, was 0.39 cm². On the other hand, the surface area S of the diffused impurity sources 24 was about 36 cm². Accordingly, the ratio $S_o/S$ was about $1.1 \times 10^{-2}$. Also the ratio V/C of the volume of diffusion chamber to the conductance of the opening for water molecules at 500° C. was less than one second. The quartz reaction tube 21 including therein the metallic aluminum 24 and silicon wafers 28 was inserted into a quartz furnace tube 30 from the lidded end thereof so that the quartz reaction tube 21 was placed in a uniformly heated region of a resistance furnace 32. The quartz furnace tube 30 was 130 mm in outer diameter, 124 mm in inner diameter and 2500 mm in length and had its one end connected to an evacuating device 29, and the other end lidded with a lid or end plate 31. The end plate 31 was sealed. Then, the atmosphere inside the furnace tube 30 was evacuated and replaced with nitrogen gas and then was continuously evacuated by means of the evacuating device 29 and a nitrogen gas container 33. The diffusion chamber was gradually heated to effect desorption of adsorbed molecules in a temperature range of about 500 to about 800° C. for more than ten minutes. After the pressure inside the tube 30 was decreased to the order of $10^{-7}$ Torr, the tube 30 was heated to and held at about 1100° C. for five hours by the furnace 32 to carry out diffusion. After slowly cooling the diffusion chamber, the end plate 31 was opened to draw out the diffusion tube. Removing the loose plug, the diffused silicon wafers were unloaded. The sheet resistivity of the diffused silicon wafers thus obtained was $25\Omega/\square \pm 2\Omega/\square$. The sheet resistivity was low and variations in sheet resistivity were small. For five runs of diffusion, the sheet resistivity of diffusion layer was $25\Omega/\square \pm 3\Omega/\square$, exhibiting a satisfactory reproducibility.

When the outer diameter of the loose plug 22 was increased to 98 mm with other parameters kept substantially the same, the ratio $S_o/S$ for aluminum molecules at the diffusion temperature was about $3 \times 10^{-3}$ and the ratio V/C for water molecules was about 1.4 seconds at 500° C. and about 1.2 seconds at 800° C. The result of diffusion was similar to the preceding example.

In the both examples, no aluminum deposition was observed on the low temperature portion of the furnace tube 30, implying that the furnace tube was almost free from the attack of aluminum vapor. The furnace tube and the diffusion tube were successively used for more than ten diffusion runs. It may be also noted that when the inner diameter of a diffusion tube was 99 mm and the length of the inner loose plug was 70 mm with the diffusion source area S=3600 mm², the ratio $S_o/S = 1 \times 10^{-1}$ corresponded to an open area of about 10% of the cross section of the diffusion tube and the ratio $S_o/S = 1 \times 10^{-3}$ corresponded to an open area of about 2% of the cross section of the diffusion tube for the case of aluminum vapor at 1100° C. Conductances for various shapes of aperture are known and can be used to estimate the conductance of the semi-closed diffusion system to be designed.

GALLIUM DIFFUSION

Gallium has a higher diffusion coefficient in silicon than boron. Accordingly, when it is desired to form a deep diffusion layer in a short period, gallium is advantageous as compared with boron. In order to form a diffusion layer having a high breakdown voltage and a long carrier lifetime it is required to use a high-purity gallium source. In this respect, elemental gallium can provide an excellent gallium source. However, elemental gallium has a very low vapor pressure at low temperatures, and is readily oxidized. Therefore, it is difficult to prevent oxidation and diffuse a desired large amount of gallium into a semiconductor substrate uniformly. Accordingly, when elemental gallium is used as the diffusion source, it is required to place both of the impurity source and semiconductor substrate in an oxygen-free space. For this reason, when elemental gallium is used as the impurity source, the semi-closed diffusion is preferably employed. Like aluminum, gallium readily reacts with quartz and greatly reduces the mechanical strength of a quartz tube. Therefore, it is advantageous to carry out gallium diffusion in a semiclosed diffusion system.

Figure 4:
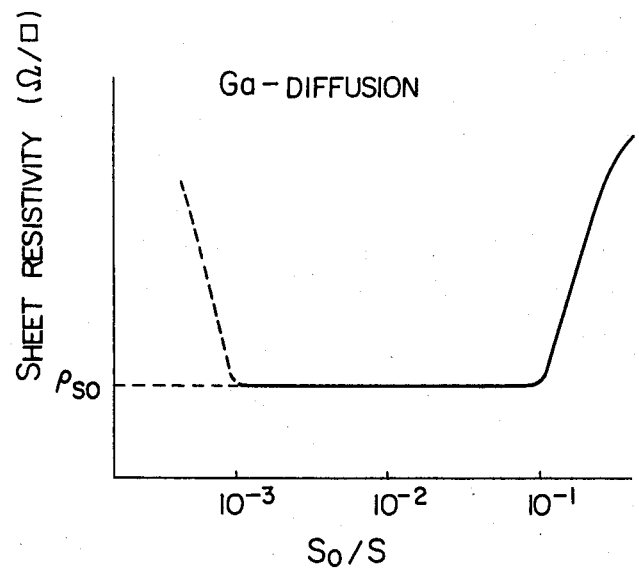

Referring to FIG. 1, a single-ended quartz diffusion tube 21, being 65 mm in outer diameter, 61 mm in inner diameter and 500 mm in length, was loaded with a silicon boat 26 having a bottom surface of 500 to 1000 mm² and 50 mg of elemental gallium serving as a diffusion source thereon, a quartz wafer holder 27 on which twenty silicon wafers 28 each having a diameter of 50 mm and a thickness of 500 $\mu$m were mounted, and another silicon boat 26 having similar bottom surface and 50 mg of elemental gallium 24 serving as the diffusion source thereon in the order described. A loose quartz plug 22 having an outer diameter of 60 mm and a length of about 70 mm was inserted into the quartz reaction tube 21 to form a semi-closed system. The reaction tube 21 was inserted into the quartz furnace tube 30 shown in FIG. 1 through the opened end. The furnace tube 30 was sealed with an end plate 31. The interior of the furnace tube 30 was evacuated and substituted with $N_2$ atmosphere repeatedly for three times by the evacuating device 29 and the inert gas container 33. Then, the furnace tube 30 was continuously evacuated to a pressure of $10^{-6}$ torr. In this state, the tube 30 was heated by a resistance furnace 32 to about 600° C. and maintained at about 600° C. for about ten minutes. Then, $N_2$ gas was gradually introduced into the furnace tube 30 to the atmospheric pressure, and the furnace tube 30 filled with $N_2$ gas at the atmospheric pressure was maintained at 600° C. for ten minutes. Then, the temperature was raised to the diffusion temperature of about 1150° C. maintained at about 1150° C. for three hours, and then cooled slowly. Nitrogen gas was released and added to keep the pressure in the furnace tube not substantially greater and less than the atmospheric pressure during heating and cooling, respectively. Opening the end plate 31, the reaction tube 21 was taken out of the furnace tube 30 at about 600° C. Removing the loose plug, diffused wafers were unloaded. A diffusion layer according to the above-mentioned diffusion had a sheet resistivity of $10\Omega/\square \pm 2\Omega/\square$. Also, for five diffusion lots, the sheet resistivity of diffusion layer was $10\Omega/\square \pm 3\Omega/\square$, showing a good reproducibility. Although gallium was diffused in an inert gas atmosphere, the inventors employed similar approach as in aluminum diffusion to investigate the diffusion phenomena. Namely, the outer diameter of the quartz plug 22 was varied to vary the aperture ratio of the reaction tube 21 so as to investigate the influence thereof on the sheet resistivity. Conductance C for the molecular flow condition and the equivalent open area $S_o$ of an imaginary aperture are used as the data analyzing parameters. The results of this experiment are shown in FIG. 4, which shows a relation between the ratio $S_o/S$ for gallium at 1150° C. and the sheet resistivity of diffusion layer. Referring to FIG. 4, when the ratio $S_o/S$ is greater than about $1 \times 10^{-1}$, the sheet resistivity becomes high and the ability to confine gallium vapor in the reaction tube 21 is considered to be lowered. Thus, it was found preferable to select the ratio of $S_o/S$ not greater than about $1 \times 10^{-1}$, by estimating $S_o$ from the molecular flow condition. The lower limit of about $1 \times 10^{-3}$ was again considered to be ascribed to the insufficient exhaust of desorbed molecules in the outgassing heat treatment. It was confirmed that the value V/C for water molecules be preferably selected not larger than about 2 seconds, and more preferably not larger than about 1.5 seconds under 450° C. condition.

Figure 5:
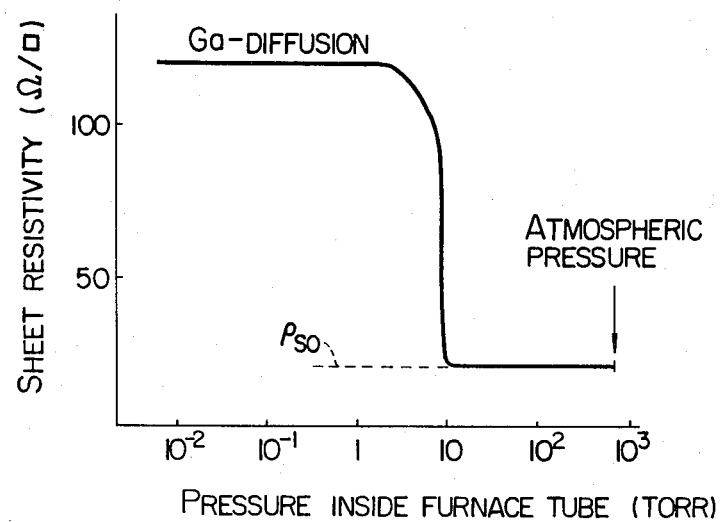

Gallium diffusion under reduced pressure was also examined. When the pressure of the inert gas was below 10 torr, however, the gallium vapor was found to effuse and deposit on the furnace tube in low temperature portions. In company with the effusion of gallium vapor, the sheet resistivity took higher values, implying that the gallium partial pressure was lowered. The data are shown in FIG. 5.

When the pressure of inert gas is in the range of about 10 torr to the atmospheric pressure, deposition of gallium on the furnace tube was found negligible and the sheet resistivity was low and uniform provided that the ratio $S_o/S$ was in the above-mentioned preferable range. Although it has been analyzed why gallium vapor can outflow from the diffusion chamber even at small values of $S_o/S$, but high vapor pressure of gallium at the diffusion temperature may be concerned. It will be apparent that the above-mentioned preferable ranges of $S_o/S$ and the pressure of inert gas can be applied for various desired values of sheet resistivity.

Figure 6:
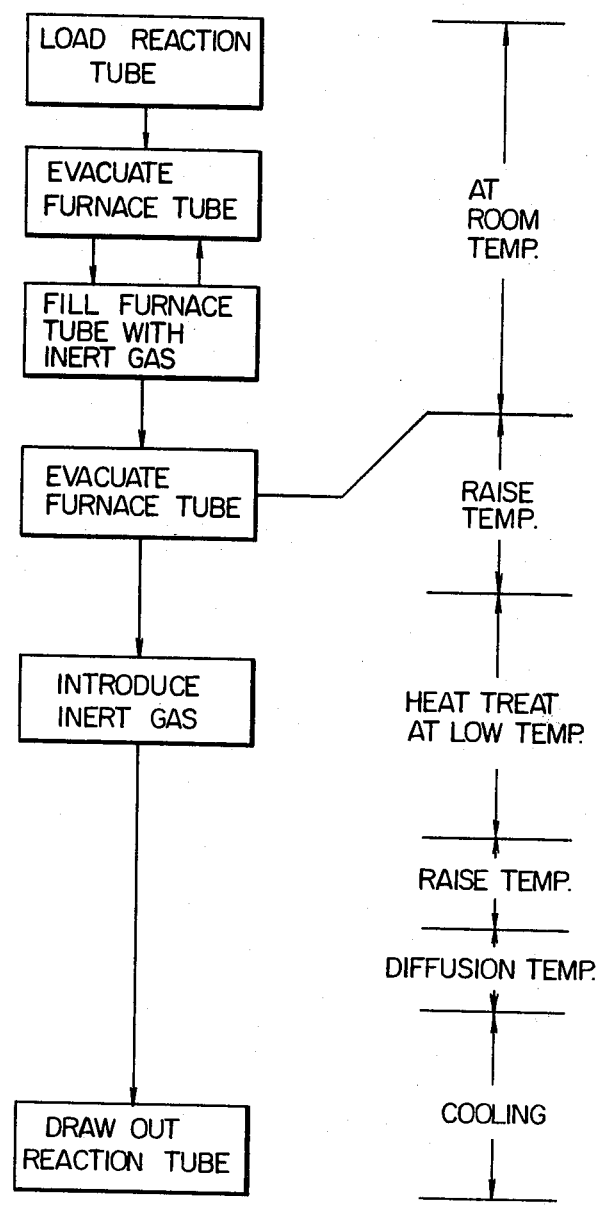
FIG. 6 is a flow chart of gallium diffusion process.

Further, it is desirable to carry out gallium diffusion in accordance with the procedure shown in FIG. 6. Referring to FIG. 6, the evacuation of the furnace tube and the filling back of the furnace tube with an inert gas are carried out several times at room temperature to make the residual oxygen in the reaction tube 21 as small as possible, thereby preventing the oxidation of gallium. Further, the furance tube is continuously evacuated at a temperature of 500° to 800° C., which is lower than the diffusion temperature. That is, the furnace tube is subjected to a low-temperature heat treatment of baking for preventing the adverse effect of useless impurity at high temperatures. In order to sufficiently remove the released oxygen and water molecules, the furnace tube is continuously evacuated at the relatively low temperature according to the above embodiment. When the furnace tube was not subjected to such degassing heat treatment, a variation of ±10% was produced in the sheet resistivity of diffusion layer. On the other hand, a variation less than ±3% in sheet resistivity of diffusion layer was found for diffusion including evacuated heat treatment.

The reaction tube 21 and furnace tube 30 could be used safely for more than ten times.

It will be apparent for those skilled in the art that various alterations and modifications of the above-described embodiments can be made within the spirit of the present invention.

For example, impurities to be diffused are not limited to aluminum and gallium, and may be boron or arsenic, etc. Semiconductor devices to be diffused with such impurity are not limited to silicon, and may be germanium. Materials of the diffusion tube, the baffle and the furnace tube may be tantalum or other refractory metals in place of quartz. Inert gas may be argon, xenon or helium in place of nitrogen. The boot may also be made of quartz, alumina or refractory metals such as tantalum, tungsten, molybdenum, etc. In the case of diffusion in the evacuated atmosphere, the pressure should be less than about $1 \times 10^{-2}$ torr, preferably less than about $1 \times 10^{-3}$ torr, and more preferably on the order of $10^{-6}$ torr or less. In the case of diffusion in the inert gas atmosphere, the amount of an inert gas to be introduced is determined by the desired pressure during diffusion or the pressure may be adjusted by evacuation and/or addition of the inert gas.

We claim:

1. A method of diffusing impurities into a semiconductor body utilizing a diffusion system which comprises a semi-closed diffusion chamber including a diffusion vessel with an opening and a removable baffle member for partially blocking the opening of said vessel to form the semi-closed diffusion chamber having a limited opening, and an evacuatable enclosure having an openable end member for accommodating said diffusion chamber therein, the diffusion vessel being adapted to accommodate said semiconductor body and a diffusion source through said opening, and the semi-closed diffusion chamber being capable of exhausting the atmosphere inside the chamber by evacuating the outside, the method comprising the steps of:

loading the diffusion source and the semi-conductor body in said diffusion vessel through said opening;

disposing said baffle member at said opening to form the semi-closed diffusion chamber having the limited opening, wherein said limited opening has a conductance for the vapor molecules of diffusion impurity, which is equal to the conductance of an imaginary opening having an open area $S_o$ and an infinitely thin thickness, based on the molecular flow condition, said diffusion source has a free surface area of S, and the value of $S_o/S$ is not larger than about $1 \times 10^{-1}$ at a diffusion temperature;

evacuating the inside of the enclosure which contains said semi-closed diffusion chamber, thereby also evacuating the inside of said diffusion chamber through said limited opening;

heating said semi-closed diffusion chamber to subject the diffusion chamber to a heat treatment at a temperature not lower than 450° C. at which substantial diffusion does not take place, while evacuating the inside of said enclosure, for desorbing and exhausting adsorbed molecules from said diffusion chamber, wherein said semi-closed diffusion chamber has a volume V, said limited opening has a conductance C for water molecules based on the molecular flow condition, and the value of V/C in said heat treatment is not larger than about two seconds;

further heating said semi-closed diffusion chamber to a diffusion temperature at which said diffusion source vaporizes and diffuses into said semiconductor body;

cooling the diffusion chamber; and removing said baffle member and unloading the semiconductor body from the diffusion chamber.

2. The method of claim 1, further comprising the steps of:

inserting said semi-closed diffusion chamber into said enclosure after said step of disposing the baffle member; and taking out said semi-closed diffusion chamber from said enclosure after said cooling step.

3. The method of claim 1, wherein the ratio $S_o/S$ is within the range of $1 \times 10^{-3}$ to $1 \times 10^{-1}$.

4. The method of claim 1, wherein said impurity is selected from the group consisting of aluminum, gallium, boron and arsenic.

5. The method of claim 1, wherein said impurity is selected from the group consisting of aluminum, gallium and boron.

6. The method of claim 5, wherein said heat treatment is carried out in a temperature range of about 500° to about 800° C. for a period not less than about 10 minutes.

7. The method of claim 1, wherein said diffusion vessel has a tubular shape having said opening at least at one end, said baffle member has a plug shape capable of being inserted into said tubular diffusion vessel, and said step of disposing the baffle member includes placing the baffle member inside the tubular diffusion vessel.

8. The method of claim 1, wherein said step of further heating said semi-closed diffusion chamber concurrently includes continuously evacuating the inside of said enclosure to a pressure of at most about $1 \times 10^2$ torr.

9. The method of claim 8, wherein said pressure is at most $1 \times 10^3$ torr and said impurity is aluminum.

10. The method of claim 1, further comprising the step of introducing an inert gas into the evacuated enclosure to a predetermined pressure after said heat treatment.

11. The method of claim 10, further comprising the combined step of backfilling the evacuated enclosure with an inert gas and evaculating the backfilled enclosure after said evacuating step.

12. The method of claim 10, wherein said predetermined pressure corresponds to a pressure of not less than about 10 torr at said diffusion temperature.

13. The method of claim 10, wherein said predetermined pressure is substantially the atmospheric pressure.

14. The method of claim 13, wherein said further heating step includes releasing the introduced inert gas by an amount required for keeping the pressure inside the enclosure substantially at the atmospheric pressure.

15. The method of claim 14, wherein said cooling step includes additionally introducing inert gas by an amount required for keeping the pressure inside the enclosure substantially at the atmospheric pressure.

16. A method of diffusing aluminum into silicon utilizing a diffusion system which comprises a furnace tube placed in a resistance furnace and having one end connected to an evacuating system and the other end fitted with an openable hermetic end plate, and an assembly of a single-ended diffusion tube and a baffle member to be fitted at the open end of said single-ended diffusion tube to form a semiclosed diffusion chamber, which semi-closed diffusion chamber has a limited opening, comprising the steps of:

loading at least one silicon wafer and an aluminum diffusion source in said diffusion tube;

fitting said baffle member at the open end of said diffusion tube to form the semi-closed diffusion chamber having the limited opening, wherein said limited opening has a conductance for the vapor molecules of diffusion impurity, which is equal to the conductance of an imaginary opening having an open area $S_o$ and an infinitely thin thickness, based on the molecular flow condition, said diffusing source has a free surface area of S, and the value of $S_o/S$ is not larger than about $1 \times 10^{-1}$ at a diffusion temperature;

inserting the semi-closed diffusion chamber into said furnace tube;

sealing the furnace tube with the end plate;

evacuating the furnace tube to a high vacuum of the order of $10^{-6}$ torr or higher vacuum;

gradually heating the diffusion chamber by the resistance furnace to subject the diffusion chamber to a heat treatment at a temperature not lower than 450° C. for desorbing and exhausting adsorbed molecules from said diffusion chamber, wherein said semi-closed diffusion chamber has a volume V, said limited opening has a conductance C for water molecules based on the molecular flow condition, and the value of V/C in said heat treatment is not larger than about two seconds;

diffusion aluminum into the silicon wafers;

slowly cooling the diffusion chamber;

opening said end plate;

taking the diffusion chamber out of the furnace tube; and removing the baffle member and unloading the diffused silicon wafer.

17. The method of claim 16, wherein the ratio $S_o/S$ is within the range of $1 \times 10^{-3}$ to $1 \times 10^{-1}$.

18. A method of diffusing gallium into silicon utilizing a diffusion system which comprises a furnace tube disposed in a resistance furnace and having one end fitted with an openable hermetic end plate and connected to an evacuating system for evacuating the furnace tube and to an inert gas container for introducing an inert gas into the furnace tube, a single-ended diffusion tube and a baffle member to be fitted at the open end of said single-ended diffusion tube for partially blocking the open end to leave a limited opening, comprising the steps of:

loading at least one silicon wafer and a gallium diffusion source in said diffusion tube;

fitting said baffle member at the open end of said diffusion tube to form said limited opening;

inserting the diffusion tube into said furnace tube;

sealing said furnace tube with the end plate;

evacuating said furnace tube;

heating said diffusion tube in a heat treatment to a temperature not lower than about 450° C. and continuously evacuating the furnace tube for exhausting desorbed molecules;

introducing the inert gas into said furnace tube;

further heating said diffusion tube to a diffusion temperature and keeping the pressure of said inert gas in a range from about 10 torr to about the atmospheric pressure, thereby diffusing gallium into said silicon wafer;

slowly cooling said diffusion tube;

opening said end plate;

drawing said diffusion tube out of the furnace tube; and removing said baffle member and unloading the diffused silicon wafer.

19. The method of claim 18, wherein the assembly of the single-ended diffusion tube and baffle form a semi-closed diffusion chamber and wherein said semi-closed diffusion chamber has a volume V, said limited opening has a conductance C for water molecules based on the molecular flow condition, and the value of V/C in said heat treatment is not larger than about two seconds, and further wherein said limited opening has another conductance for the vapor molecules of diffusion impurity, which is equal to the conductance of an imaginary opening having an open area $S_o$ and an infinitely thin thickness, based on the molecular flow condition, said diffusion source has a free surface area of S, and the value of $S_o/S$ is not larger than about $1 \times 10^{-1}$ at the diffusion temperature.

20. The method of claim 19, wherein the ratio $S_o/S$ is within the range of $1 \times 10^{-3}$ to $1 \times 10^{-1}$.

* * * * *